(12) United States Patent
Kang

(10) Patent No.: US 12,708,009 B2
(45) Date of Patent: Aug. 11, 2026

(54) SEMICONDUCTOR PACKAGE WITH ORGANIC INTERPOSER

(71) Applicant: SAMSUNG ELECTRONICS CO., LTD., Suwon-si (KR)

(72) Inventor: Myung Sam Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 625 days.

(21) Appl. No.: 18/139,535

(22) Filed: Apr. 26, 2023

(65) Prior Publication Data

US 2024/0079302 A1 Mar. 7, 2024

(30) Foreign Application Priority Data

Sep. 1, 2022 (KR) ........................ 10-2022-0110852

(51) Int. Cl.

*H10W 70/685* (2026.01)
*H10W 70/05* (2026.01)
*H10W 74/01* (2026.01)
*H10P 72/70* (2026.01)
*H10W 70/69* (2026.01)
*H10W 72/00* (2026.01)

(Continued)

(52) U.S. Cl.

CPC ......... *H10W 70/685* (2026.01); *H10W 70/05* (2026.01); *H10W 70/093* (2026.01); *H10W 70/095* (2026.01); *H10W 74/019* (2026.01); *H10P 72/74* (2026.01); *H10P 72/7424* (2026.01); *H10W 70/69* (2026.01); *H10W 72/072* (2026.01); *H10W 72/07207* (2026.01); *H10W 72/241* (2026.01); *H10W 74/141* (2026.01); *H10W 90/00* (2026.01); *H10W 90/724* (2026.01)

(58) Field of Classification Search

CPC ........... H01L 23/49822; H01L 21/4857; H01L 23/49894; H01L 25/0655; H01L 23/5383; H01L 23/5386; H01L 2224/02331; H01L 23/49827; H01L 23/5384; H01L 21/486; H01L 23/145; H01L 23/293; H10W 70/685; H10W 70/05; H10W 70/093; H10W 70/095

See application file for complete search history.

(56) References Cited

U.S. PATENT DOCUMENTS 8,872,326 B2 10/2014 Lin et al.
9,247,647 B1 1/2016 Yoon et al.

(Continued)

FOREIGN PATENT DOCUMENTS

KR 10-2019-0050620 A 5/2019
KR 10-2022-0037947 A 3/2022

OTHER PUBLICATIONS

Communication issued Jan. 12, 2026 by the Korean Ministry of Intellectual Property in Korean Patent Application No. 10-2022-0110852.

*Primary Examiner* — Evan G Clinton
(74) *Attorney, Agent, or Firm* — Sughrue Mion, PLLC

(57) ABSTRACT

A semiconductor package includes a package substrate, an organic interposer on the package substrate, the organic interposer including a plurality of organic insulating layers including an organic compound, at least two semiconductor chips on the organic interposer, and a mold, on an upper surface of the organic interposer, surrounding the at least two semiconductor chips.

20 Claims, 10 Drawing Sheets

(51) Int. Cl.

| | |
|---|---|
| *H10W 72/20* | (2026.01) |
| *H10W 74/10* | (2026.01) |
| *H10W 90/00* | (2026.01) |

(56) References Cited

U.S. PATENT DOCUMENTS

| | | | | |
|---|---|---|---|---|
| 9,922,845 | B1 | 3/2018 | Shih | |
| 11,088,068 | B2 | 8/2021 | Kuo et al. | |
| 11,211,325 | B2 | 12/2021 | Huang et al. | |
| 11,232,998 | B2 | 1/2022 | Jhong et al. | |
| 11,329,014 | B2 | 5/2022 | Kang et al. | |
| 2016/0133562 | A1* | 5/2016 | Lee | H01L 21/481<br>438/126 |
| 2021/0125905 | A1* | 4/2021 | Huang | H01L 23/49827 |
| 2022/0102280 | A1* | 3/2022 | Dabral | H01L 22/12 |
| 2022/0406723 | A1* | 12/2022 | Tsai | H01L 23/49838 |
| 2024/0049427 | A1* | 2/2024 | Chang | F25D 3/10 |

* cited by examiner

FIG. 1
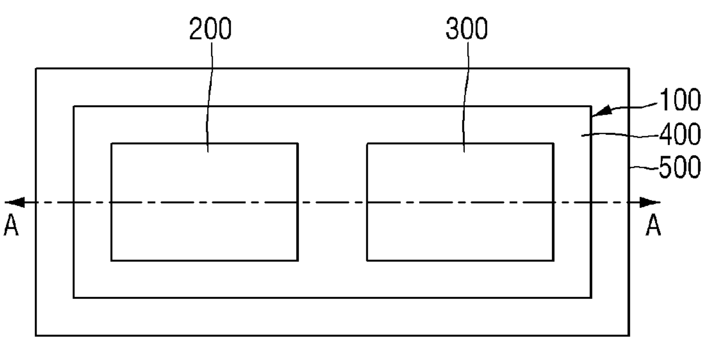
FIG. 2
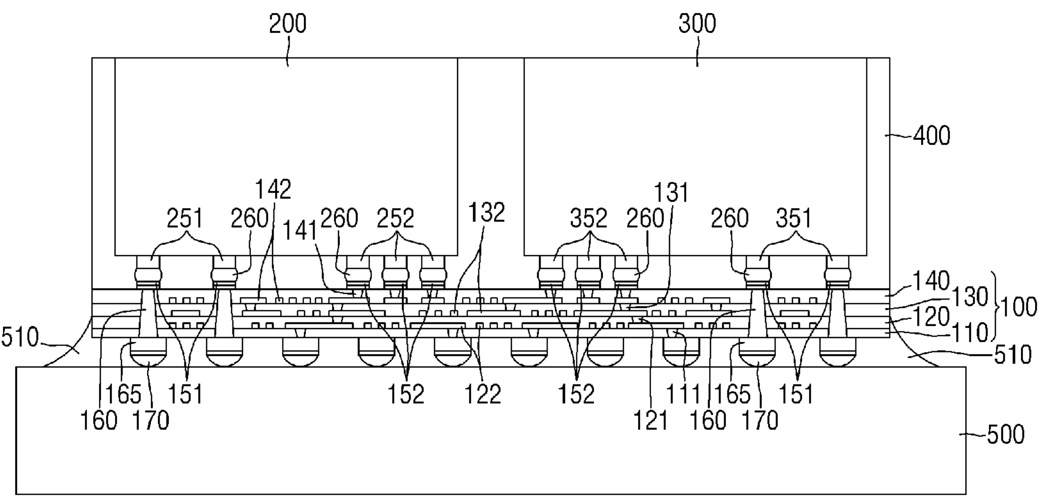
FIG. 3
11
10

SEMICONDUCTOR PACKAGE WITH ORGANIC INTERPOSER

CROSS-REFERENCE TO RELATED APPLICATION(S)

This application is based on and claims priority to Korean Patent Application No. 10-2022-0110852, filed on Sep. 1, 2022, in the Korean Intellectual Property Office, the disclosure of which is incorporated herein by reference in its entirety.

BACKGROUND

1. Field

One or more example embodiments relate to a semiconductor package with an organic interposer.

2. Description of the Related Art

An interposer market is growing due to high specifications of set and adoption of a high bandwidth memory (HBM).

In the related art, although silicon has been the mainstream for the interposer market, types that use glass or organic substances have been developed due to having large area and a low cost. In particular, in a semiconductor device to which an interposer using silicon is applied, signal loss (in terms of signal integrity (SI)) occurs due to a parasitic inductance inside the interposer, and power loss (in terms of power integrity (PI)) occurs.

Accordingly, it is necessary to develop an interposer having a large area and a low cost and is improved in terms of SI and PI.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided is a semiconductor package including an organic interposer having a large area, manufactured at a low cost, and improved in terms of signal integrity (SI) and power integrity (PI).

Additional aspects will be set forth in part in the description which follows and, in part, will be apparent from the description, or may be learned by practice of the presented embodiments.

According to an aspect of an example embodiment, a semiconductor package may include a package substrate, an organic interposer on the package substrate, the organic interposer including a plurality of organic insulating layers including an organic compound, at least two semiconductor chips on the organic interposer, and a mold, on an upper surface of the organic interposer, surrounding the at least two semiconductor chips.

According to an aspect of an example embodiment, a semiconductor package may include a package substrate, an organic interposer on the package substrate, the organic interposer including a stacked structure including a first organic insulating layer, a second organic insulating layer, a third organic insulating layer, and a fourth organic insulating layer including an organic compound, a first semiconductor chip and a second semiconductor chip on the organic interposer, and a mold surrounding the first semiconductor chip and the second semiconductor chip from an upper surface of the organic interposer.

According to an aspect of an example embodiment, a semiconductor package may include a package substrate, an organic interposer on the package substrate, the organic interposer including a stacked structure including a first organic insulating layer, a second organic insulating layer, a third organic insulating layer, and a fourth organic insulating layer including an organic compound, a first semiconductor chip and a second semiconductor chip on the organic interposer, a final mold surrounding the first semiconductor chip and the second semiconductor chip from an upper surface of the organic interposer, a heat dissipation member on first upper surfaces and first upper portions of outer walls of the first semiconductor chip and on second upper surfaces and second upper portions of the second semiconductor chip, the heat dissipation member abutting the final mold, and an under fill surrounding a plurality of lower pads and a plurality of lower bumps, the plurality of lower pads and the plurality of lower bumps being on a lower surface of the organic interposer between the organic interposer and the package substrate, where a plurality of first vias penetrating from the first organic insulating layer to the fourth organic insulating layer, and connecting first upper pads on an upper surface of the fourth organic insulating layer and lower pads on a lower surface of the first organic insulating layer, a plurality of redistribution layers in each of the first organic insulating layer, the second organic insulating layer, the third organic insulating layer, and the fourth organic insulating layer, and a plurality of second vias connecting at least two of the plurality of redistribution layers inside the first organic insulating layer, the second organic insulating layer, the third organic insulating layer, and the fourth organic insulating layer, and where the plurality of first vias have a width that widens in a direction from the first upper pads to the lower pads/

BRIEF DESCRIPTION OF DRAWINGS

The above and other aspects, features, and advantages of certain example embodiments of the present disclosure will be more apparent from the following description taken in conjunction with the accompanying drawings, in which:

FIG. 1 is a diagram of a semiconductor package according to an example embodiment;

FIG. 2 is a cross-sectional view taken along a line A-A of FIG. 1 according to an example embodiment;

FIGS. 3, 4, 5, 6, 7, 8, 9, 10, 11 and 12 are diagrams of a method for fabricating the semiconductor package according to an example embodiment;

DETAILED DESCRIPTION

Figure 4:
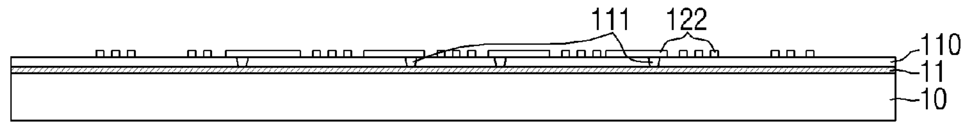

Objects, particular advantages and novel features of the disclosure will become more apparent from the following detailed description and preferred embodiments taken in conjunction with the accompanying drawings. In this specification, when adding reference numbers to the constituent elements of each drawing, even if the same constituent elements are displayed in different drawings, it should be noted that they are indicated to have the same number as much as possible. Additionally, although the terms such as first and second are used to describe various constituent elements, the aforementioned constituent elements are not limited by these terms. These terms are only used to distinguish a single constituent element from other constituent elements.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a diagram of a semiconductor package according to an example embodiment. FIG. 2 is a cross-sectional view taken along a line A-A of FIG. 1 according to an example embodiment.

As shown in FIGS. 1 and 2, the semiconductor package according to an embodiment of the disclosure may include a package substrate 500, an organic interposer 100 mounted on the package substrate 500, a first semiconductor chip 200 and a second semiconductor chip 300 mounted on the organic interposer 100, and a mold 400 that surrounds the first semiconductor chip 200 and the second semiconductor chip 300 on an upper surface of the organic interposer 100.

The organic interposer 100 may include a plurality of organic insulating layers 110, 120, 130, and 140 composed of an organic compound, a plurality of first vias 160 that penetrate the plurality of organic insulating layers 110, 120, 130, and 140 and connect an upper pad 151 and a lower pad 165, a plurality of redistribution layers 122, 132, and 142 provided inside the plurality of organic insulating layers 110, 120, 130, and 140, and a plurality of second vias 111, 121, 131, and 141 that connect at least one of the plurality of redistribution layers 122, 132, and 142 inside the plurality of organic insulating layers 110, 120, 130, and 140.

Although the plurality of organic insulating layers 110, 120, 130 and 140 are shown as the first organic insulating layer 110, the second organic insulating layer 120, the third organic insulating layer 130 and the fourth organic insulating layer 140 in FIG. 2, they may be provided as a multilayer structure of five or more layers without being limited thereto.

The plurality of organic insulating layers 110, 120, 130, and 140, for example, may have a thickness of up to about 50 μm, and each layer may be formed of an organic compound, such as thermosetting resins including acrylate resin, maleimide resin, allyl nadiimide resin, phenolic resin and epoxy resin, thermoplastic resins such as a polyimide, an Ajinomoto build-up film (ABF) obtained by mixing the resins with inorganic filler, or a pre-preg obtained by impregnating reinforced fiber (such as carbon fiber, glass fiber and aramid fiber) with thermosetting polymer binders (e.g., epoxy resin) or thermoplastic resin.

The plurality of organic insulating layers 110, 120, 130, and 140 may be formed of an organic photosensitive insulating material such as, for example, a photoimageable dielectric (PID) resin. When the plurality of organic insulating layers 110, 120, 130, and 140 are formed of insulating layers having organic photosensitive properties such as PID resin, each of the plurality of organic insulating layers 110, 120, 130, and 140 may be thin, and a fine pitch of the plurality of first via 160 and the plurality of second vias 111, 121, 131, and 141 may be achieved more easily. Each of the plurality of organic insulating layers 110, 120, 130, and 140 may be made of the same material, or may be made of different materials, if desired.

The plurality of first vias 160 may penetrate the plurality of organic insulating layers 110, 120, 130 and 140 to connect a first upper pad 151 provided on an upper surface of the fourth organic insulating layer 140 and a lower pad 165 provided on a lower surface of the first organic insulating layer 110. The plurality of first vias 160 may be formed to have a diameter of, for example, about μm 30 to about 60 μm. The plurality of first vias 160 may be provided for an electrical connection of each of the first semiconductor chip 200 and the second semiconductor chip 300 to the package substrate 500. The plurality of first vias 160 may be formed such that a width a direction from the first upper pad 151 toward the lower pad 165 widens.

The plurality of first vias 160 may penetrate the plurality of organic insulating layers 110, 120, 130, and 140 by a method such as laser drilling, wet etching or dry etching, and by filling a conductive metal material including aluminum (Al), copper (Cu), tin (Sn), nickel (Ni), gold (Au), platinum (Pt) or alloys thereof by a plating process, an electroless plating process, a vapor phase deposition process or the like.

A plurality of redistribution layers 122, 132, and 142 are provided in each or a portion of the plurality of organic insulating layers 110, 120, 130, and 140, and may form an electrical connection between the first semiconductor chip 200 and the second semiconductor chip 300 through the plurality of second vias 111, 121, 131, and 141 and the plurality of second upper pads 152.

The plurality of redistribution layers 122, 132, and 142 may be formed to have a line width (line/space) of about 1/1 μm to 3/3 μm. The plurality of redistribution layers 122, 132, and 142 may be formed by removing a portion of the layer in the form of line grooves using methods such as laser drilling, wet etching or dry etching in the formation process of each layer of the plurality of organic insulating layers 110, 120, 130, and 140, and by filling the line grooves with conductive metal materials including aluminum (Al), copper (Cu), tin (Sn), nickel (Ni), gold (Au), platinum (Pt) or alloys thereof, for example, using a plating process, an electroless plating process, a vapor phase deposition process or the like.

The plurality of second vias 111, 121, 131, and 141 may provide an electrical connection between the plurality of redistribution layers 122, 132, and 142, an electrical connection to the plurality of second upper pads 152, and an electrical connection to the lower pad 165. The plurality of second vias 111, 121, 131 and 141 may be formed to have, for example, a diameter of about μm 5 to about 15 μm, and may be formed to have a width that narrows in the direction from the plurality of second upper pads 152 to the lower pad 165, in contrast to the shape of the plurality of first vias 160.

The organic interposer 100 may be mounted on the package substrate 500 by the flip-chip bonding type via the lower bumps 170 provided on the plurality of lower pads 165.

The organic interposer 100 may include a plurality of organic insulating layers 110, 120, 130, and 140, and may have a dielectric constant lower than that of a conventional interposer. A line width of a plurality of redistribution layers 122, 132, and 142 may be formed to be finer than a related art redistribution layer. Accordingly, it is possible to reduce a signal loss due to internal parasitic inductance in terms of the signal integrity (SI).

In addition, the organic interposer 100 may include a plurality of first vias 160 to form an electrical connection between the first semiconductor chip 200 and the second semiconductor chip 300 to the package substrate 500, and may prevent a power loss in terms of power integrity (PI).

The first semiconductor chip 200 and the second semiconductor chip 300 may each be connected to the organic interposer 100 through the upper bumps 260, for example, by the flip-chip bonding type. The first semiconductor chip 200 and the second semiconductor chip 300 may be semiconductor chips that perform various functions, such as a memory, logic, a micro-processor, an analog element, a digital signal processor, and a system-on-chip. Each of the first semiconductor chip 200 and the second semiconductor chip 300 may be a multi-chip having a structure in which at least two semiconductor chips are stacked.

Both the first semiconductor chip 200 and the second semiconductor chip 300 may be the same type of memory element, or one thereof may be a memory element and the other thereof may be a micro-controller element.

The mold 400 may be formed to cover side walls of the first semiconductor chip 200 and the second semiconductor chip 300 from the upper surface of the organic interposer 100. The mold 400 may expose the upper surfaces of the first semiconductor chip 200 and the second semiconductor chip 300. The mold 400 may be formed to expose the upper surfaces of the first semiconductor chip 200 and the second semiconductor chip 300, thereby promoting heat dissipation of each of the first semiconductor chip 200 and the second semiconductor chip 300.

The mold 400 may be formed, for example, through a molded under fill (MUF) process, for example, using an epoxy molding compound (EMC) or heterogeneous or more silicon hybrid materials. The MUF process may refer to a process that fills a space between the upper surface of the organic interposer 100, the first semiconductor chip 200 and the second semiconductor chip 300 with the molding material together, without separately performing a process of filling the space between the upper surface of the organic interposer 100, the first semiconductor chip 200 and the second semiconductor chip 300 with an under fill.

The mold 400 may be formed by processes other than the MUF process. That is, the molding may be performed by a process of first filling the molding material between the first semiconductor chip 200 and the second semiconductor chip 300 on the upper surface of the organic interposer 100 with the under fill, and then, covering the side walls of the first semiconductor chip 200 and the second semiconductor chip 300 with the molding material.

The package substrate 500 may include, for example, various package substrates, such as a printed circuit board, a flip chip-ball grid array (FCBGA) substrate, a ball grid array (BGA) substrate, or a low temperature co-fired ceramic (LTCC) substrate. Alternatively, the package substrate 500 may include at least one insulating layer and metal wiring layer. The metal wiring layer may be a circuit pattern formed inside the package substrate 500, and may be formed of, for example, aluminum (Al) or copper (Cu). The surface of such a metal wiring layer may be plated with tin (Sb), gold (Au), nickel (Ni), lead (Pb) or the like.

The package substrate 500 may also include conductive pads for the electrical connection between the first semiconductor chip 200 and the second semiconductor chip 300 via the lower bumps 170. Such conductive pads may be formed of, for example, aluminum (Al) or copper (Cu). The surface of such conductive pads may be plated with, for example, tin (Sb), gold (Au), nickel (Ni), lead (Pb), or the like.

The under fill 510 may be filled to surround the plurality of lower pads 165 and the lower bumps 170 between the organic interposer 100 and the package substrate 500. The under fill 510 may be formed using epoxy resin, benzocyclobutene resin or polyimide resin. The under fill 510 may further include, for example, a silica filler, and may include an adhesive and flux, without being limited thereto. The flux may include an oxide film remover.

The semiconductor package according to an embodiment of the disclosure may reduce an internal signal loss in terms of SI, using the organic interposer 100 including a plurality of organic insulating layers 110, 120, 130, and 140 composed of an organic compound, the plurality of first vias 160 and the plurality of second vias 111, 121, 131, and 141 having opposite shapes to each other. The semiconductor package according to an embodiment of the disclosure may reduce a power loss in terms of a PI through the plurality of first vias 160.

A method for fabricating a semiconductor package according to an embodiment of the disclosure will be described below with reference to FIGS. 3 to 12.

FIGS. 3, 4, 5, 6, 7, 8, 9, 10, 11 and 12 are diagrams of a method for fabricating the semiconductor package according to an example embodiment.

In the method for fabricating the semiconductor package according to an embodiment of the disclosure, first, a release layer 11 may be provided on the upper surface of the first carrier substrate 10, as shown in FIG. 3.

The first carrier substrate 10 may be a substrate of a structure including a core layer and a metal film formed on the core layer. The release layer 11 may be a layer that is provided for an easy separation of the organic interposer 100 from the first carrier substrate 10 in a subsequent process step, and, for example, made of a composition that is releasable by a laser. The release layer 11 may use a generally releasable composition in addition to the composition that is releasable by the laser.

After providing the release layer 11, as shown in FIG. 4, the first organic insulating layer 110 including the plurality of second vias 111 inside may be formed on the upper surface of the release layer 11.

The first organic insulating layer 110 may be formed, using an organic compound, such as, thermosetting resins including acrylate resin, maleimide resin, allyl nadiimide resin, phenolic resin and epoxy resin, thermoplastic resins such as polyimide, an ABF obtained by mixing the resins with inorganic filler, or a pre-preg obtained by impregnating reinforced fiber such as carbon fiber, glass fiber and aramid fiber with thermosetting polymer binders (for example, epoxy resin) or thermoplastic resin.

The first organic insulating layer 110 may be formed, using an organic photosensitive insulating material such as, for example, a PID resin.

After forming the first organic insulating layer 110, a plurality of second vias 111 may be formed by removing a partial region of the first organic insulating layer 110 in the form of grooves by methods such as laser drilling, wet etching or dry etching, and by filling the grooves with conductive metal materials including aluminum (Al), copper (Cu), tin (Sn), nickel (Ni), gold (Au), platinum (Pt) or alloys thereof, for example, using a plating process, an electroless plating process, a vapor phase deposition process or the like.

The plurality of second vias 111 may be formed to have a width that narrows in the direction from the upper surface of the first organic insulating layer 110 to the release layer 11.

After forming the plurality of second vias 111, a plurality of first redistribution layers 122 may be formed on the upper surface of the first organic insulating layer 110.

The plurality of first redistribution layers 122 may be formed by forming a photoresist (PR) layer on the upper surface of the first organic insulating layer 110, removing the PR layer in the form of line groves using methods such as laser drilling, wet etching and dry etching, and then, filling the line grooves with conductive metal materials including aluminum (Al), copper (Cu), tin (Sn), nickel (Ni), gold (Au), platinum (Pt) or alloys thereof, for example, using a plating process, an electroless plating process, a vapor phase deposition process or the like, and removing only the PR layer.

Figure 5:
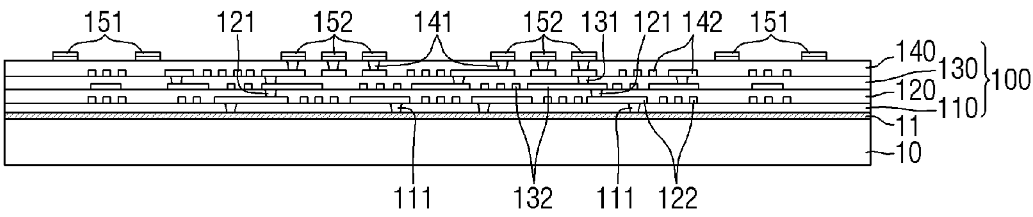

As shown in FIG. 5, a second organic insulating layer 120, a third organic insulating layer 130, and a fourth organic insulating layer 140 may be sequentially formed in the direction of the upper surface of the first organic insulating layer 110.

Each of the second organic insulating layer 120, the third organic insulating layer 130, and the fourth organic insulating layer 140 may be provided with the plurality of second vias 121, 131 and 141 and the plurality of redistribution layers 132 and 142 in the same manner as the plurality of second vias 111 and the plurality of first redistribution layers 122.

After sequentially forming the second organic insulating layer 120, the third organic insulating layer 130, and the fourth organic insulating layer 140, a plurality of first upper pads 151 and a plurality of second upper pads 152 may be formed on the upper surface of the fourth organic insulating layer 140 as shown in FIG. 5.

The plurality of first upper pads 151 may be formed by two in parallel along an upper surface boundary region of the fourth organic insulating layer 140 on which the plurality of first vias 160 are formed, and the plurality of second upper pads 152 may be formed to be connected to a plurality of second vias 141 at the center of the upper surface of the fourth organic insulating layer 140 between the plurality of first upper pads 151.

Figure 6:
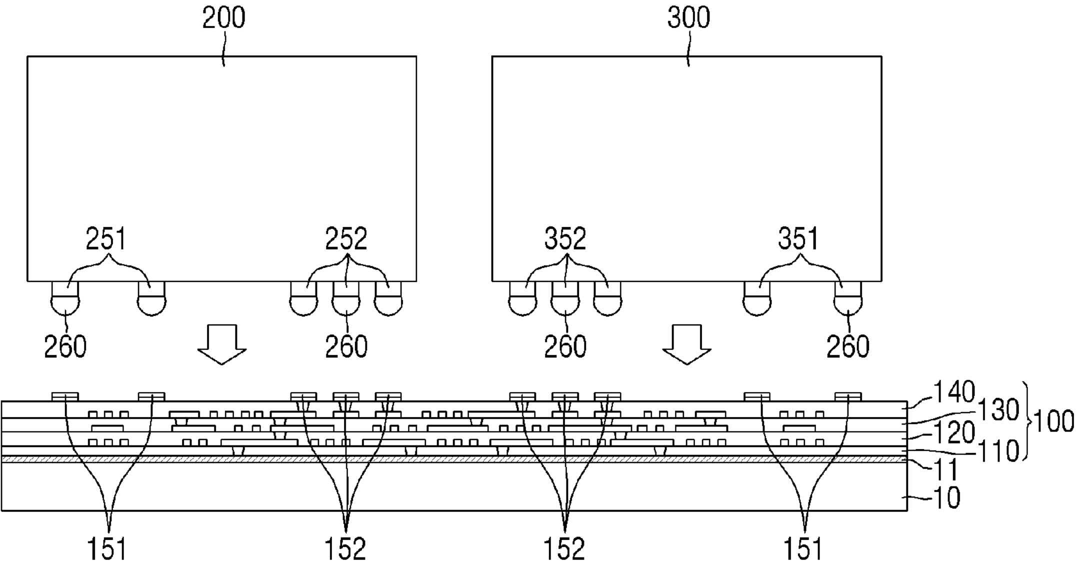

After forming the plurality of first upper pads 151 and the plurality of second upper pads 152, as shown in FIG. 6, the first semiconductor chip 200 and the second semiconductor chip 300 may be mounted on the plurality of first upper pads 151 and the plurality of second upper pads 152.

The first semiconductor chip 200 may include a plurality of first lower pads 251 and a plurality of second lower pads 252 on a lower surface thereof. The plurality of first lower pads 251 may be mounted on each of the plurality of first upper pads 151 provided on one side region of the upper surface of the fourth organic insulating layer 140, using the bumps 260. The plurality of second lower pads 252 may also be mounted on each of the plurality of second upper pads 152 provided in one side region of the upper surface of the fourth organic insulating layer 140, using the bumps 260.

The second semiconductor chip 300 also may have a plurality of first lower pads 351 and a plurality of second lower pads 352 on a lower surface thereof. The plurality of first lower pads 351 may be mounted on each of the plurality of first upper pads 151 provided on the other side region of the upper surface of the fourth organic insulating layer 140, using the bumps 260. The plurality of second lower pads 252 may also be mounted on the plurality of second upper pads 152 provided in the other side region of the upper surface of the fourth organic insulating layer 140, using the bumps 260.

The plurality of first lower pads 251 and the plurality of second lower pads 252 provided on the first semiconductor chip 200 may be provided symmetrically with the plurality of first lower pads 351 and the plurality of second lower pads 352 provided on the second semiconductor chip 300. The plurality of first lower pads 251 and 351 may be provided in an outward direction, and the plurality of second lower pads 252 and 352 may be provided in an inward direction. The plurality of first lower pads 251 and 351, and the plurality of second lower pads 252 and 352 may be mounted on the upper surface of the organic insulating layer 140.

The first semiconductor chip 200 and the second semiconductor chip 300 may be semiconductor chips that perform various functions, such as a memory, logic, a microprocessor, an analog element, a digital signal processor, and a system-on-chip. Each of the first semiconductor chip 200 and the second semiconductor chip 300 may be a multi-chip having a structure in which at least two semiconductor chips are stacked.

Both the first semiconductor chip 200 and the second semiconductor chip 300 may be the same type of memory element, or one thereof may be a memory element and the other thereof may be a micro-controller element.

Figure 7:
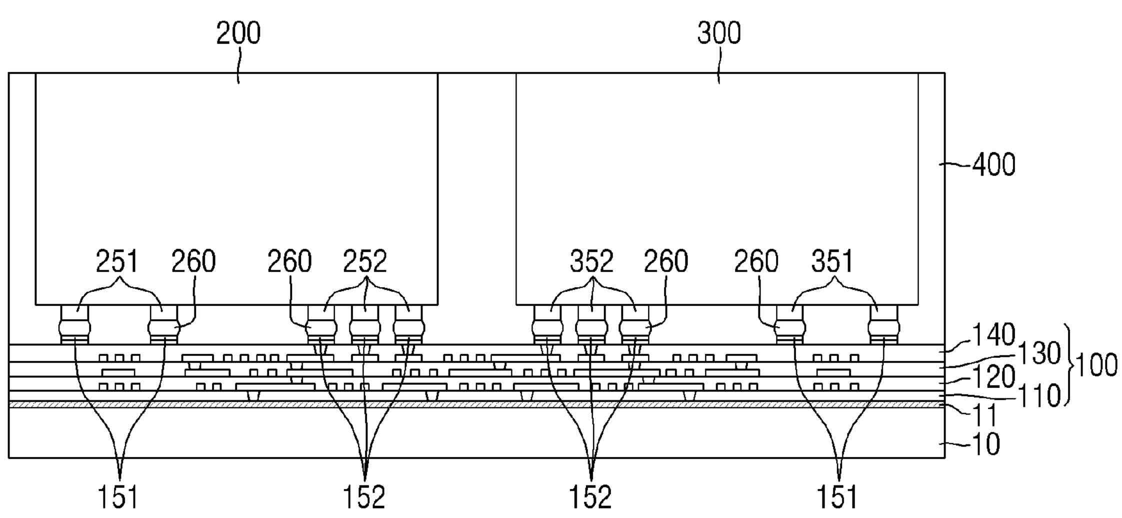

After mounting the first semiconductor chip 200 and the second semiconductor chip 300, as shown in FIG. 7, the mold 400 that covers the side walls of the first semiconductor chip 200 and the second semiconductor chip 300 from the upper surface of the fourth organic insulating layer 140 may be formed.

The method for forming the mold 400 may include a MUF process, for example, using a molding material such as an EMC or heterogeneous or more silicon hybrid materials. The MUF process may refer to a process that fills a space between the first semiconductor chip 200 and the second semiconductor chip 300 on the upper surface of the organic interposer 100 with the molding material together, without separately performing a process of filling the space between the first semiconductor chip 200 and the second semiconductor chip 300 on the upper surface of the organic interposer 100 with an under fill, using the molding material.

The mold 400 may be formed by processes other than the MUF process. That is, the molding may be performed by a process of first filling a space between the first semiconductor chip 200 and the second semiconductor chip 300 from the upper surface of the organic interposer 100 with the molding material by the under fill, and then, covering the side walls of the first semiconductor chip 200 and the second semiconductor chip 300 with the molding material.

The upper surfaces of the first semiconductor chip 200 and the second semiconductor chip 300 may be exposed by a grinding process or a chemical mechanical polishing (CMP) process, on the basis of the upper surfaces of the first semiconductor chip 200 and the second semiconductor chip 300.

Figure 8:
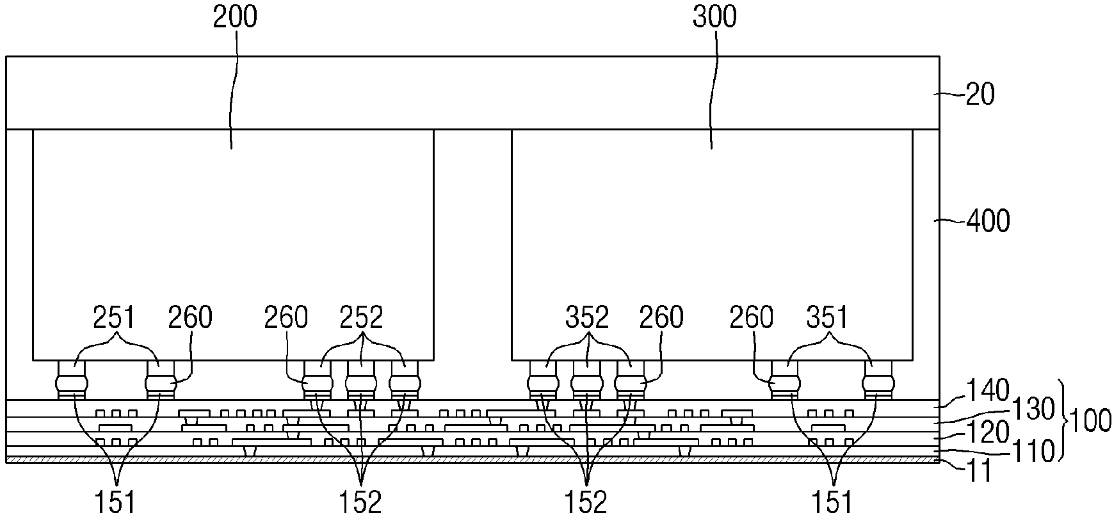

After forming the mold 400, as shown in FIG. 8, the first carrier substrate 10 may be removed, and the second carrier substrate 20 may be mounted on the upper surface of the mold 400 and the upper surfaces of the first semiconductor chip 200 and the second semiconductor chip 300

In the removal of the first carrier substrate 10, the first carrier substrate 10 may be separated from the release layer 11 by irradiating the release layer 11 with a laser. In addition, the second carrier substrate 20 may be bonded and mounted on the upper surface of the mold 400 and the upper surfaces of the first semiconductor chip 200 and the second semiconductor chip 300, using an adhesive layer. Similar to the first carrier substrate 10, the second carrier substrate 20 may be a substrate having a structure including a core layer and a metal film formed on the core layer.

Figure 9:
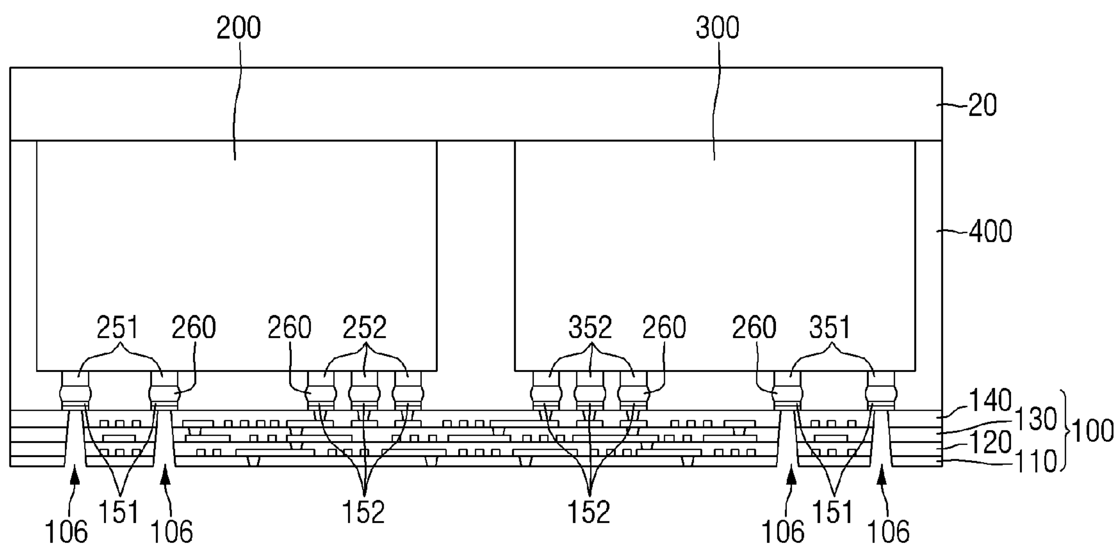

After mounting the second carrier substrate 20, as shown in FIG. 9, a plurality of via grooves 106, which penetrate from the first organic insulating layer 110 to the fourth organic insulating layer 140, that is, penetrate to the plurality of first upper pads 151 provided on one side region of the upper surface of the fourth organic insulating layer 140, may be formed The plurality of via grooves 106 may include grooves that have a width that narrows from the lower surface of the first organic insulating layer 110 to the plurality of first upper pads 151, and the plurality of via grooves 106 may be formed by a method such as laser drilling, wet etching, or dry etching.

Figure 10:
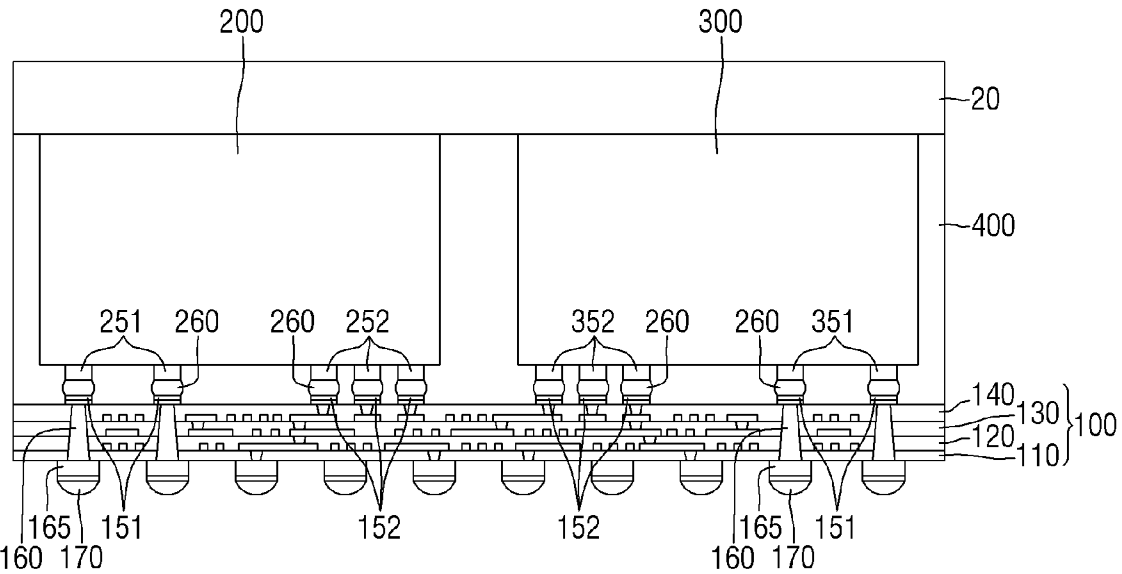

After forming the plurality of via grooves 106, as shown in FIG. 10, the plurality of via grooves 106 may be filled with a conductive metal material to form the plurality of first vias 160, and the plurality of lower pads 165 may be formed on the lower surface of the first organic insulating layer 110, including the lower portion of the plurality of first vias 160.

The plurality of first vias 160 may be formed by filling the plurality of via grooves 106 with the conductive metal materials including aluminum (Al), copper (Cu), tin (Sn), nickel (Ni), gold (Au), platinum (Pt), or alloys thereof, for example, using a plating process, an electroless plating process, or a vapor deposition process.

After forming the plurality of first vias 160, the plurality of lower pads 165 may be formed on the lower surface of the first organic insulating layer 110, including the lower portions of the first vias 160. The plurality of lower pads 165 may be formed of, for example, aluminum (Al) or copper (Cu), and the surfaces of the plurality of lower pads 165 may be plated with, for example, tin (Sb), gold (Au), nickel (Ni), lead (Pb) or the like.

Each of the plurality of lower pads 165 may include a lower bump 170 at its lower portion. The lower bump 170 may use, for example, a C4 bump.

Figure 11:
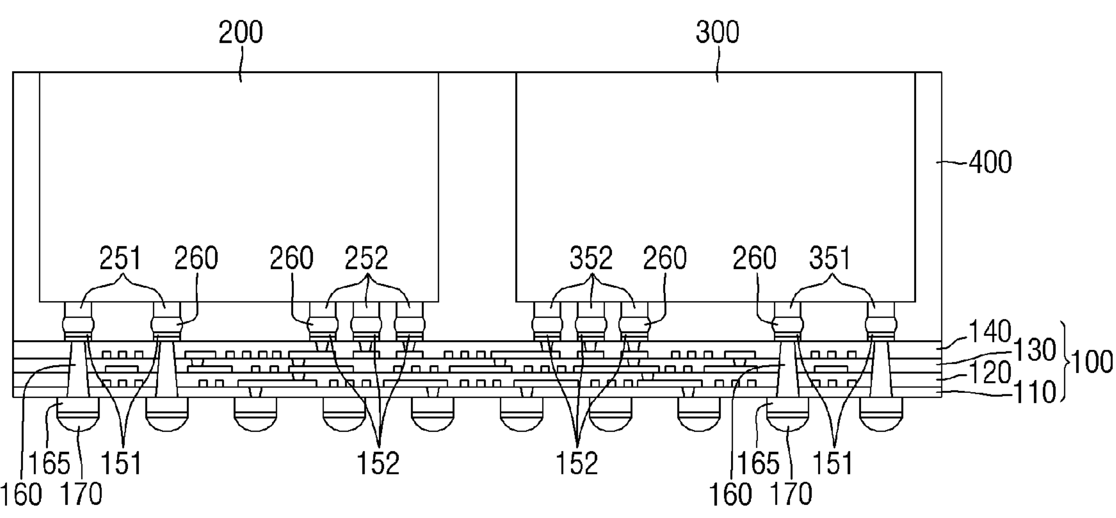
Figure 12:
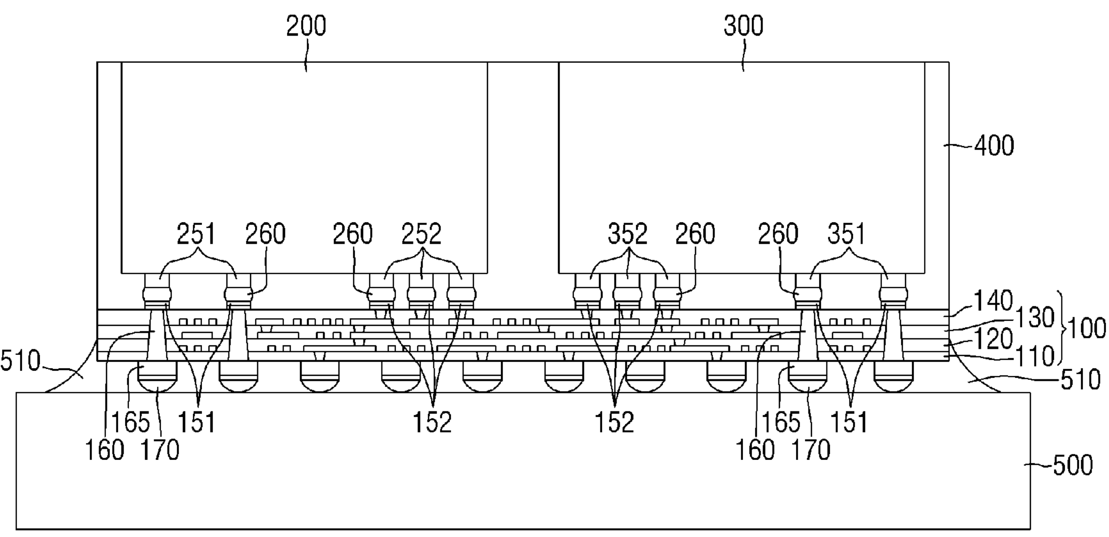

The second carrier substrate 20 may be removed as shown in FIG. 11, and the structure shown in FIG. 11 may be mounted on the package substrate 500 using the lower bumps 170 as shown in FIG. 12.

The package substrate 500 may include, for example, various package substrates, such as a printed circuit board, a FCBGA substrate, a BGA substrate, or a LTCC substrate. Alternatively, the package substrate 500 may include at least one insulating layer and metal wiring layer. The metal wiring layer may be a circuit pattern formed inside the package substrate 500, and may be formed of, for example, aluminum (Al) or copper (Cu). The surface of such metal wiring layers may be plated with tin (Sb), gold (Au), nickel (Ni), lead (Pb) or the like.

After the structure shown in FIG. 11 is mounted on the upper surface of the package substrate 500 using the lower bumps 170, an under fill 510 that surrounds the plurality of lower pads 165 and lower bumps 170 may be formed between the organic interposer 100 and the package substrate 500.

The under fill 510 may be filled to surround the plurality of lower pads 165 and lower bumps 170 between the organic interposer 100 and the package substrate 500, for example, using epoxy resin, benzocyclobutyne resin or polyimide resin.

Alternatively, the under fill 510 may further include, but is not limited to, a silica filler and may include an adhesive and flux. The flux may include an oxide film remover.

The method for fabricating a semiconductor package according to an embodiment of the disclosure including the aforementioned process may provide a semiconductor package that may reduce an internal signal loss in terms of a SI and prevent a power loss in terms of a PI through a plurality of first vias 160, by easily forming the organic interposer 100 including the first via 160 and the second vias 111, 121, 131, and 141 provided in opposite shapes to each other.

Figure 13:
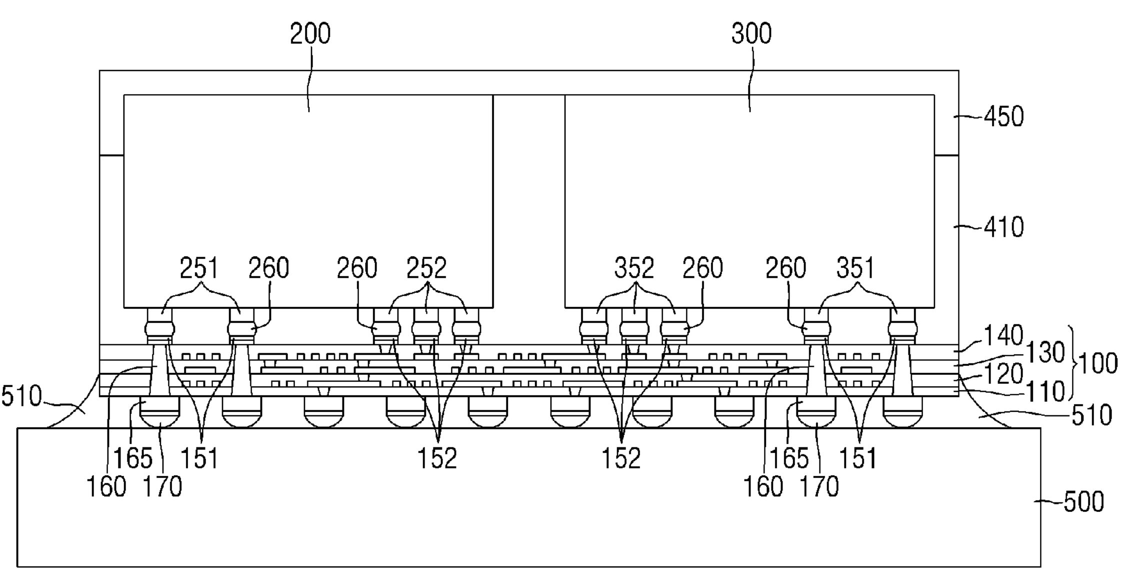
FIG. 13 is a cross-sectional view of a semiconductor package according to an example embodiment.

FIG. 13 is a cross-sectional view of a semiconductor package according to an example embodiment.

As shown in FIG. 13, the semiconductor package according to an embodiment of the disclosure may include a package substrate 500, an organic interposer 100 mounted on the package substrate 500, a first semiconductor chip 200 and a second semiconductor chip 300 mounted on the organic interposer 100, a final mold 410 that surrounds the first semiconductor chip 200 and the second semiconductor chip 300 on the upper surface of the organic interposer 100, and a heat dissipation member 450 that is attached to the upper surfaces and upper parts of the side walls of the first semiconductor chip 200 and the second semiconductor chip 300 to abut on the final mold 410. The heat dissipation member 450 may be attached using a thermal interface material (TIM).

In the semiconductor package of FIG. 13, the final mold 410 may be provided to partially surround the outer walls of the first semiconductor chip 200 and the second semiconductor chip 300, and the heat dissipation member 450 may be attached to the upper surfaces and the upper portions of the side walls of the first semiconductor chip 200 and the upper surfaces and the upper portions of the side walls of the second semiconductor chip 300, butting on the final mold 410 on the outer walls of the first semiconductor chip 200 and the second semiconductor chip 300.

The heat dissipation member 450 may be formed of thermally conductive materials, such as one or more from a group including non-metal materials such as carbon and silicon, metal materials such as nickel (Ni), copper, copper alloy, aluminum, aluminum alloy, steel and stainless steel, metal oxides such as magnesium oxide, alumina and titanium dioxide (TiO2), and metal nitrides, or combinations thereof.

The TIM may include, for example, mineral oil, grease, gap filler putty, phase change gel, phase change material pads, particle filled epoxy, and the like. However, the TIM is not limited thereto, and may include various materials with excellent thermal conductivity.

The heat dissipation member 450 may be provided in advance, and may be attached up to about 50% of the height of the outer wall at the outer walls of the first semiconductor chip 200 and the second semiconductor chip 300 to abut on the final mold 410.

Since the heat dissipation member 450 attached in this way transfers and dissipates heat generated from each of the first semiconductor chip 200 and the second semiconductor chip 300 together not only vertically but also laterally, the semiconductor package of FIG. 13 may improve a heat dissipation efficiency.

In addition, the semiconductor package of FIG. 13 may obtain electromagnetic interference (EMI) shielding, due to a structure in which the heat dissipation member 450 surrounds the first semiconductor chip 200 and the second semiconductor chip 300 vertically and laterally.

Figure 14:
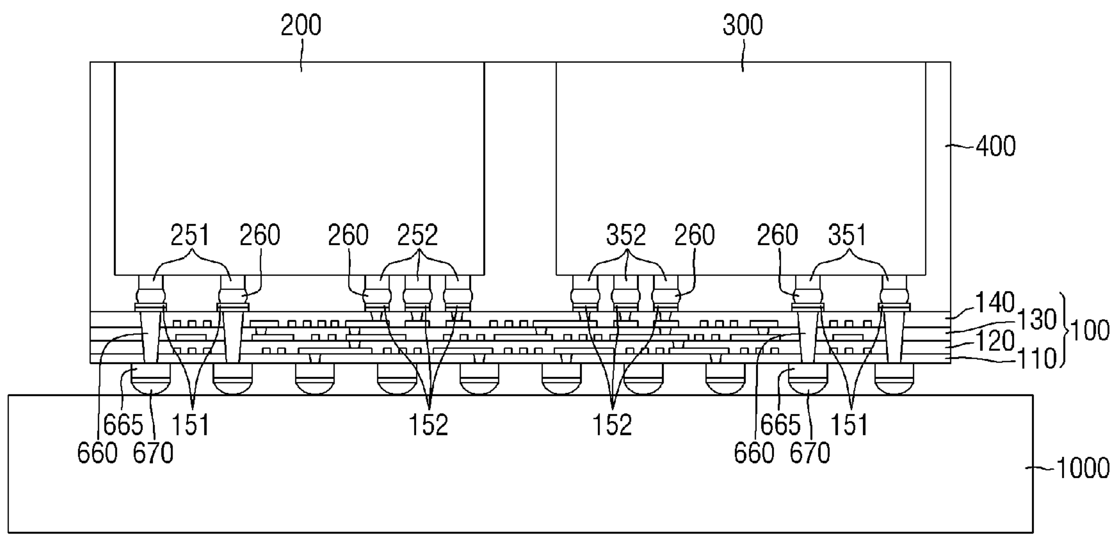
FIG. 14 is a cross-sectional view of a semiconductor package according to an example embodiment.

FIG. 14 is a cross-sectional view of a semiconductor package according to an example embodiment.

As shown in FIG. 14, the semiconductor package may include a package substrate 500, an organic interposer 100 mounted on the package substrate 500, a first semiconductor chip 200 and a second semiconductor chip 300 mounted on the organic interposer 100, and a mold 400 that surrounds the first semiconductor chip 200 and the second semiconductor chip 300 on the upper surface of the organic interposer 100.

The semiconductor package of FIG. 14 may include a plurality of first vias 660 constituting the organic interposer 100, which may have a width that narrows in the direction from the first upper pad 151 to a lower pad 665 provided on the lower surface of the first organic insulating layer 110. The plurality of first vias 600 may include shapes similar to the shapes of the plurality of second vias 111, 121, 131, and 141.

The method for fabricating the semiconductor package of FIG. 14, equipped with the organic interposer 100 including the plurality of first vias 660, may different from the method for fabricating the semiconductor package shown in FIGS. 3-12.

FIGS. 15, 16, 17, 18, 19, 20, 21, and 22 are diagrams of a method for fabricating a semiconductor package according to an example embodiment.

Figure 15:
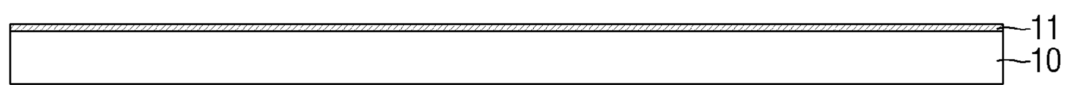
FIGS. 15, 16, 17, 18, 19, 20, 21, and 22 are diagrams of a method for fabricating a semiconductor package according to an example embodiment.

In As shown in FIG. 15, a release layer 11 may be provided on the upper surface of the first carrier substrate 10.

The first carrier substrate 10 may be a substrate of a structure including a core layer and a metal film formed on the core layer. The release layer 11 may be a layer provided for an easy separation of the organic interposer 100 from the first carrier substrate 10 in a subsequent process step. The release layer 11 may be made of a composition that is releasable by a laser. The release layer 11 may use a general releasable composition in addition to the composition that is releasable by a laser.

Figure 16:
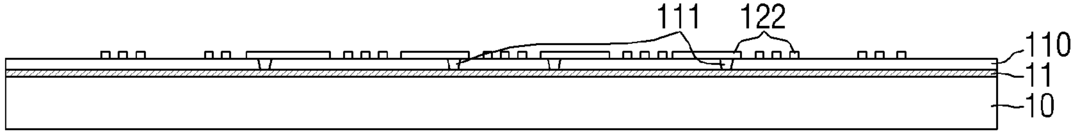

After providing the release layer 11, as shown in FIG. 16, the first organic insulating layer 110 including the plurality of second vias 111 inside may be formed on the upper surface of the release layer 11.

The first organic insulating layer 110 may be formed with an organic compound, for example, thermosetting resins such as acrylate resin, maleimide resin, allyl nadiimide resin, phenolic resin and epoxy resin, thermoplastic resins such as polyimide, an ABF obtained by mixing the resins with an inorganic filler, or a pre-preg obtained by impregnating reinforced fiber such as carbon fiber, glass fiber and aramid fiber with thermosetting polymer binders (for example, epoxy resin) or thermoplastic resin.

The first organic insulating layer 110 may be formed using an organic photosensitive insulating material such as, for example, a PID resin.

After forming the first organic insulating layer 110, a plurality of second vias 111 may be formed by removing a partial region of the first organic insulating layer 110 in the form of grooves by methods such as laser drilling, wet etching or dry etching, and by filling the grooves with conductive metal materials including aluminum (Al), copper (Cu), tin (Sn), nickel (Ni), gold (Au), platinum (Pt) or alloys thereof, for example, using a plating process, an electroless plating process, a vapor phase deposition process or the like.

The plurality of second vias 111 may be formed to have a width that narrows in the direction from the upper surface of the first organic insulating layer 110 to the release layer 11.

After forming the plurality of second vias 111, a plurality of first redistribution layers 122 may be formed on the upper surface of the first organic insulating layer 110.

The plurality of first redistribution layers 122 may be formed, by forming a PR layer on the upper surface of the first organic insulating layer 110, removing the PR layer in the form of line groves using methods such as laser drilling, wet etching and dry etching, then, filling the line grooves with conductive metal materials including aluminum (Al), copper (Cu), tin (Sn), nickel (Ni), gold (Au), platinum (Pt) or alloys thereof, for example, using a plating process, an electroless plating process, a vapor phase deposition process or the like, and removing only the PR layer.

Figure 17:
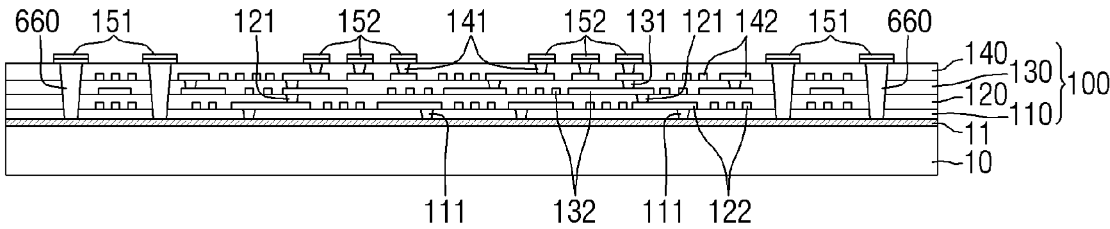

As shown in FIG. 17, a second organic insulating layer 120, a third organic insulating layer 130, and a fourth organic insulating layer 140 may be sequentially formed in the direction of the upper surface of the first organic insulating layer 110.

Each of the second organic insulating layer 120, the third organic insulating layer 130, and the fourth organic insulating layer 140 may be provided with the plurality of second vias and the plurality of redistribution layers in the same manner as the plurality of second vias 111 and the plurality of first redistribution layers 122.

After sequentially forming the second organic insulating layer 120, the third organic insulating layer 130, and the fourth organic insulating layer 140, a plurality of via grooves that penetrate from the upper surface of the fourth organic insulating layer 140 to the first organic insulating layer 110 to expose the upper surface of the release layer 11 may be formed.

The plurality of via grooves may be formed in the form of grooves having a width that narrows from the upper surface of the fourth organic insulating layer 140 to the upper surface of the release layer 11, using methods such as laser drilling, wet etching, and dry etching.

After forming the plurality of via grooves, the plurality of via grooves may be filled with a conductive metal material to form the plurality of first vias 660, and the first upper pad 151 may be formed on each of the plurality of first vias 660. The plurality of second upper pads 152 is formed on each of the plurality of second vias 141 provided in the fourth organic insulating layer 140.

The plurality of first vias 660 may be formed by filling the plurality of via grooves with conductive metal materials including aluminum (Al), copper (Cu), tin (Sn), nickel (Ni), gold (Au), platinum (Pt) or alloys thereof, for example, by a plating process, an electroless plating process, a vapor phase deposition process or the like.

After forming the plurality of first vias 660, the plurality of first upper pads 151 connected to each of the plurality of first vias 660, and the plurality of second upper pads 152 connected to each of the plurality of second vias 141 are formed on the upper surface of the fourth organic insulating layer 140.

The plurality of first upper pads 151 and the plurality of second upper pads 152 may be formed of, for example, aluminum (Al) or copper (Cu), and the surfaces thereof may be plated with, for example, tin (Sb), gold (Au), nickel (Ni), lead (Pb) or the like.

The plurality of first upper pads may be are formed by two in parallel along an upper surface boundary region of the fourth organic insulating layer 140 on which the plurality of first vias 660 are formed, and the plurality of second upper pads 152 may be formed to be connected to the plurality of second vias 141 at the center of the upper surface of the fourth organic insulating layer 140 between the plurality of first upper pads 151.

Figure 18:
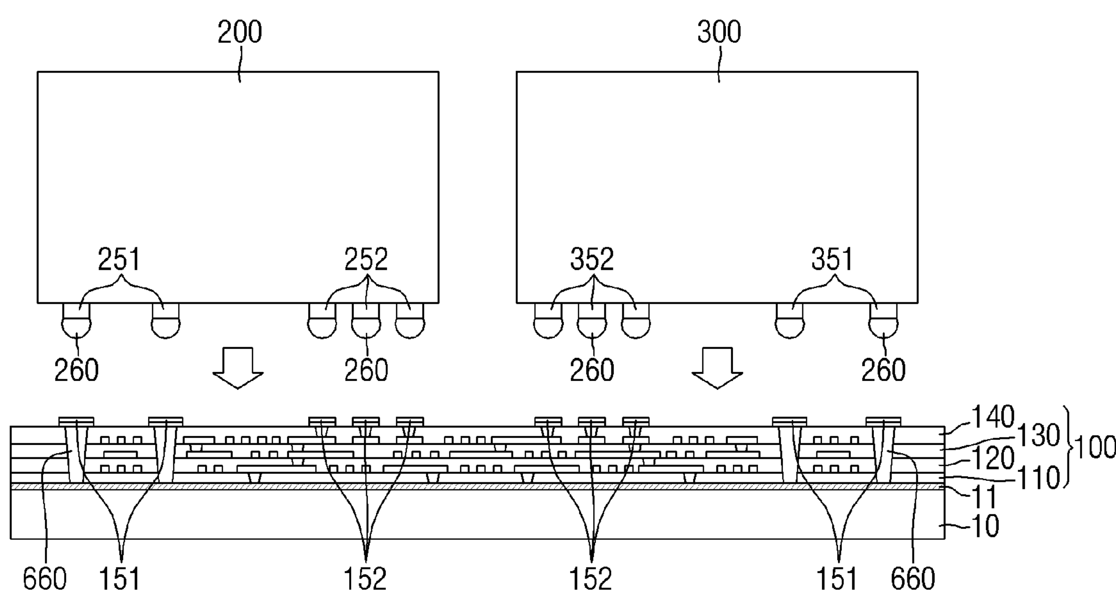

After forming the plurality of first upper pads 151 and the plurality of second upper pads 152, as shown in FIG. 18, the first semiconductor chip 200 and the second semiconductor chip 300 may be mounted on the plurality of first upper pads 151 and the plurality of second upper pads 152.

The first semiconductor chip 200 may include the plurality of first lower pads 251 and second lower pads 252 on its lower surface. The plurality of first lower pads 251 may be mounted on each of the plurality of first upper pads 151 provided on one side region of the upper surface of the fourth organic insulating layer 140, using the bumps 260. The plurality of second lower pads 252 may also be mounted on each of the plurality of second upper pads 152 provided in one side region of the upper surface of the fourth organic insulating layer 140, using the bumps 260.

The second semiconductor chip 300 may include a plurality of first lower pads 351 and a plurality of second lower pads 352 on its lower surface. The plurality of first lower pads 351 may be mounted on each of the plurality of first upper pads 151 provided on the other side region of the upper surface of the fourth organic insulating layer 140, using the bumps 260. The plurality of second lower pads 252 may also be mounted on the plurality of second upper pads 152 provided in the other side region of the upper surface of the fourth organic insulating layer 140, using the bumps 260.

The plurality of first lower pads 251 and the plurality of second lower pads 252 provided on the first semiconductor chip 200 may be provided symmetrically with the plurality of first lower pads 351 and the plurality of second lower pads 352 provided on the second semiconductor chip 300. The plurality of first lower pads 251 and the plurality of first lower pads 351 may be provided in an outward direction. The plurality of second lower pads 252 and the plurality of second lower pads 352 may be provided in an inward direction, and may be mounted on the upper surface of the organic insulating layer 140.

The first semiconductor chip 200 and the second semiconductor chip 300 may be semiconductor chips that perform various functions, such as a memory, logic, a microprocessor, an analog element, a digital signal processor, and a system-on-chip. Also, each of the first semiconductor chip 200 and the second semiconductor chip 300 may be a multi-chip having a structure in which at least two semiconductor chips are stacked.

In particular, both the first semiconductor chip 200 and the second semiconductor chip 300 may be the same type of memory element, or one thereof may be a memory element and the other thereof may be a micro-controller element.

Figure 19:
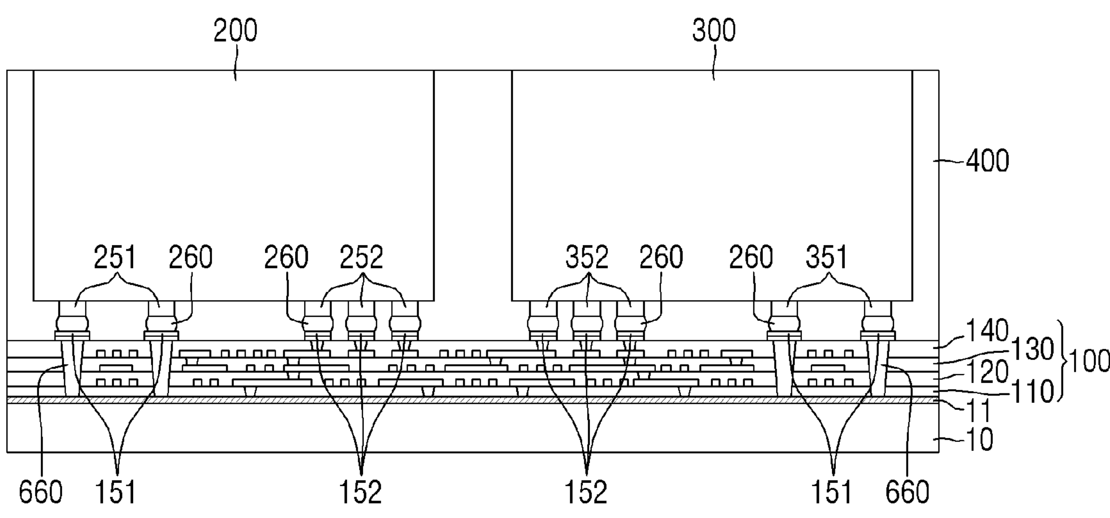

After mounting the first semiconductor chip 200 and the second semiconductor chip 300, as shown in FIG. 19, the mold 400 that covers the side walls of the first semiconductor chip 200 and the second semiconductor chip 300 from the upper surface of the fourth organic insulating layer 140 may be formed.

The mold 400 may be formed through, for example, a MUF process using a molding material such as an EMC or heterogeneous or more silicon hybrid materials. The MUF process may refer to a process that fills a space between the first semiconductor chip 200 and the second semiconductor chip 300 on the upper surface of the organic interposer 100 with the molding material together, without separately performing a process of filling the space between the first semiconductor chip 200 and the second semiconductor chip 300 on the upper surface of the organic interposer 100 with an under fill, using the molding material.

The mold 400 may be formed by processes other than the MUF process. That is, the molding may be performed by a process of first filling a space between the first semiconductor chip 200 and the second semiconductor chip 300 from the upper surface of the organic interposer 100 with the molding material by the under fill, and then, covering the side walls of the first semiconductor chip 200 and the second semiconductor chip 300 with the molding material.

Thereafter, the upper surfaces of the first semiconductor chip 200 and the second semiconductor chip 300 may be exposed by a grinding process or a CMP process on the basis of the upper surfaces of the first semiconductor chip 200 and the second semiconductor chip 300.

Figure 20:
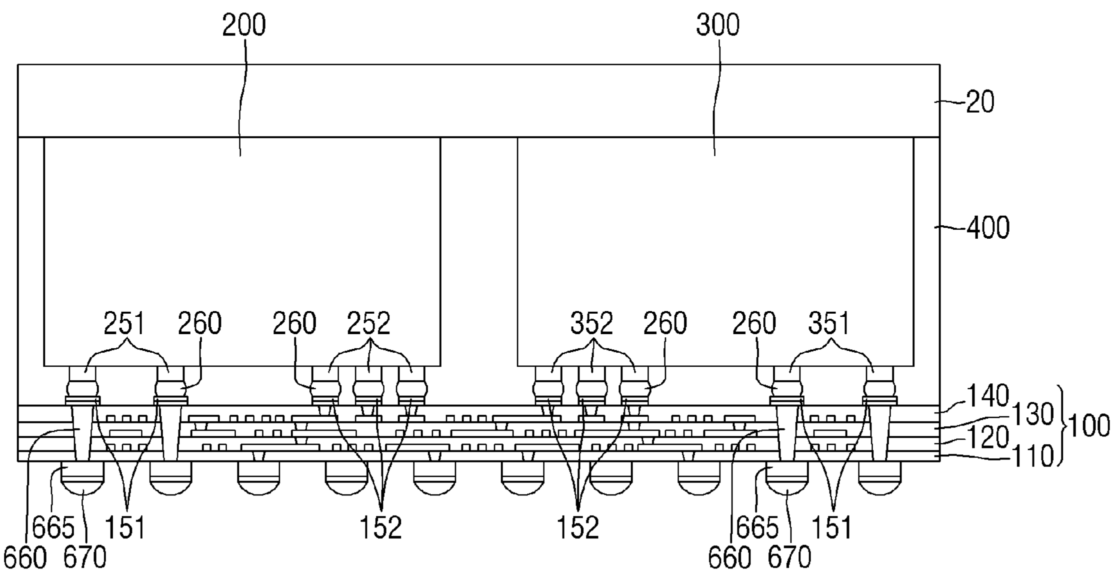

After forming the mold 400, as shown in FIG. 20, the first carrier substrate 10 and the release layer 11 may be removed, and the second carrier substrate 20 may be mounted on the upper surface of the mold 400 and the upper surfaces of the first semiconductor chip 200 and the second semiconductor chip 300

In the removal of the first carrier substrate 10 and the release layer 11, for example, the first carrier substrate 10 may be separated from the release layer 11 by irradiating the release layer 11 with a laser, and the release layer 11 may be removed by a cleaning process.

In addition, the second carrier substrate 20 may be bonded and mounted on the upper surface of the mold 400 and the upper surfaces of the first semiconductor chip 200 and the second semiconductor chip 300, using an adhesive layer. The second carrier substrate 20 may be a substrate having a structure including a core layer and a metal film formed on the core layer.

After mounting the second carrier substrate 20, as shown in FIG. 20, the plurality of lower pads 665 may be formed on the lower surface of the first organic insulating layer 110, including the lower portions of the first vias 160. The plurality of lower pads 665 may be formed of, for example, aluminum (Al) or copper (Cu), and the surfaces of the plurality of lower pads 665 may be plated with, for example, tin (Sb), gold (Au), nickel (Ni), lead (Pb) or the like.

Each of the plurality of lower pads 665 may include a lower bump 670 at a lower portion thereof. The lower bump 670 may use, for example, a C4 bump.

Figure 21:
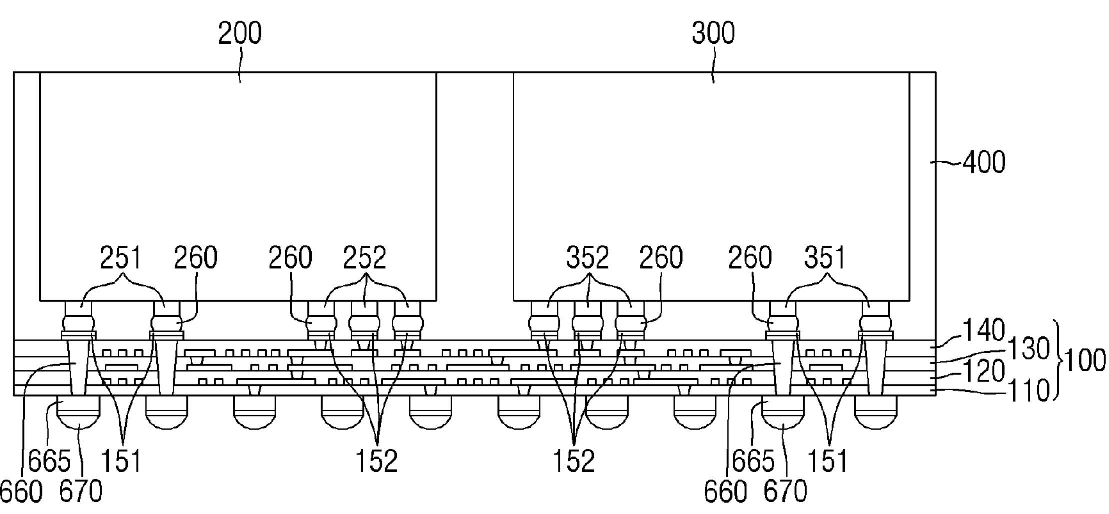
Figure 22:
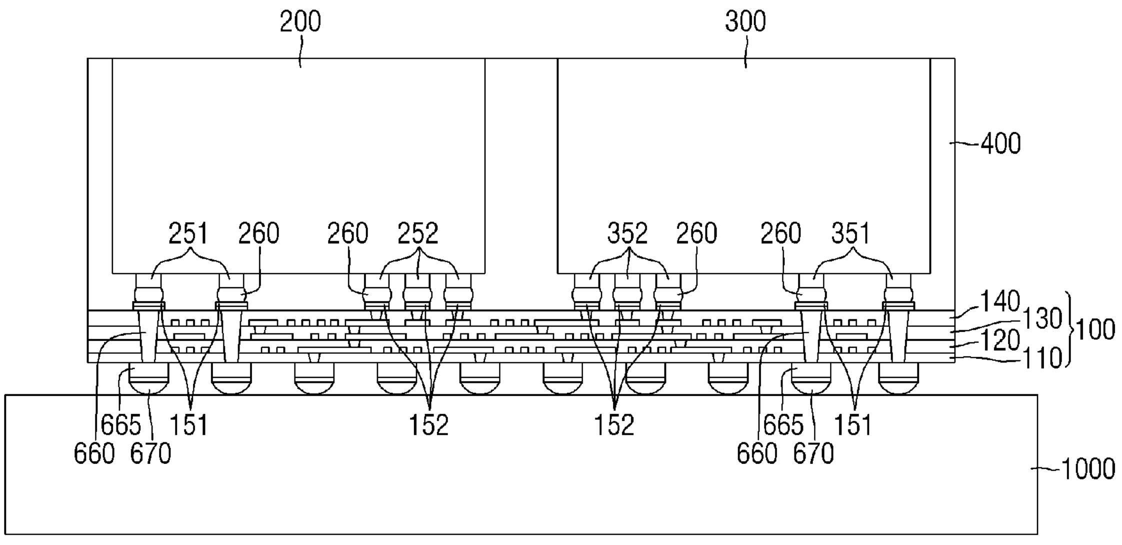

The second carrier substrate 20 may be removed as shown in FIG. 21, and the structure shown in FIG. 21 may be mounted on a package substrate 1000 using the lower bumps 170 as shown in FIG. 22.

The package substrate 1000 may include, for example, various package substrates, such as a printed circuit board, a FCBGA substrate, a BGA substrate, or a LTCC substrate. Alternatively, the package substrate 1000 may include at least one insulating layer and metal wiring layer. The metal wiring layer may be a circuit pattern formed inside the package substrate 1000, and may be formed of, for example, aluminum (Al) or copper (Cu). The surface of such metal wiring layer may be plated with tin (Sb), gold (Au), nickel (Ni), lead (Pb) or the like.

The method for fabricating a semiconductor package according to an embodiment provides a semiconductor package including the organic interposer 100 in which the plurality of vias 660 have a width that narrows in the direction from the first upper pad 151 to the lower pad 665 provided on the lower surface of the first organic insulating layer 110, similar to the shape of the plurality of second vias 111, 121, 131, and 141.

The method for fabricating the semiconductor package according to an embodiment may further form an under fill that surrounds the plurality of lower pads 665 and the lower bumps 670 between the organic interposer 100 and the package substrate 1000, and a heat dissipation member that abuts on the upper surfaces of the first semiconductor chip 200 and the second semiconductor chip 300 may be provided.

In the organic interposer, small vias connecting a first semiconductor chip and a second semiconductor chip may be formed by a build-up method, and direct vias connecting the chips and the FCBGA substrate may be formed after mounting the first semiconductor chip and the second semiconductor chip. Small vias and direct vias have different processing directions.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor package comprising:
- a package substrate;
- an organic interposer on the package substrate, the organic interposer comprising a plurality of organic insulating layers comprising an organic compound;
- at least two semiconductor chips on the organic interposer; and
- a mold, on an upper surface of the organic interposer, surrounding the at least two semiconductor chips,
- wherein the organic interposer comprises a plurality of first vias penetrating the plurality of organic insulating layers and connecting a first upper pad with a lower pad,
- wherein the plurality of first vias have a width that narrows in a direction from the lower pad to the first upper pad, and
- wherein an upper surface of at least one of the plurality of first vias is aligned with a lower surface of the mold.

2. The semiconductor package of claim 1, wherein the organic interposer has a thickness equal to or smaller than about 50 μm.

3. The semiconductor package of claim 1, wherein the organic interposer comprises:
- a plurality of redistribution layers in each of the plurality of organic insulating layers; and
- a plurality of second vias connecting at least two of the plurality of redistribution layers inside the plurality of organic insulating layers.

4. The semiconductor package of claim 3, wherein the plurality of first vias have a diameter of about 30 μm to about 60 μm.

5. The semiconductor package of claim 3, wherein the plurality of redistribution layers have a line width of about 1/1 μm to about 3/3 μm.

6. The semiconductor package of claim 3, wherein the plurality of second vias have a diameter of about 5 μm to about 15 μm, and
- wherein the plurality of second vias have a width that narrows toward the lower pad.

7. The semiconductor package of claim 1, wherein the mold is on a side wall of the at least two semiconductor chips on the upper surface of the organic interposer, and
- wherein the mold exposes an upper surface of the at least two semiconductor chips.

8. The semiconductor package of claim 1, further comprising an under fill surrounding a plurality of lower pads and a plurality of lower bumps, the plurality of lower pads and the plurality of lower bumps being on a lower surface of the organic interposer between the organic interposer and the package substrate.

9. A semiconductor package comprising:
- a package substrate;
- an organic interposer on the package substrate, the organic interposer comprising a stacked structure comprising a first organic insulating layer, a second organic insulating layer, a third organic insulating layer, and a fourth organic insulating layer comprising an organic compound;
- a first semiconductor chip and a second semiconductor chip on the organic interposer; and
- a mold surrounding the first semiconductor chip and the second semiconductor chip from an upper surface of the organic interposer,
- wherein the organic interposer further comprises:
  - a plurality of first upper pads on an upper surface of the fourth organic insulating layer,
  - a plurality of lower pads on a lower surface of the first organic insulating layer, and,
  - a plurality of first vias penetrating the first organic insulating layer, the second organic insulating layer, the third organic insulating layer, and the fourth organic insulating layer and connecting the plurality of first upper pads with the plurality of lower pads, and
- wherein the plurality of first vias have a width that narrows in a direction from the plurality of first upper pads to the plurality of lower pads.

10. The semiconductor package of claim 9, wherein the organic interposer further comprises:
- a plurality of redistribution layers in each of the first organic insulating layer, the second organic insulating layer, the third organic insulating layer, and the fourth organic insulating layer; and
- a plurality of second vias connecting at least two of the plurality of redistribution layers inside the first organic insulating layer, the second organic insulating layer, the third organic insulating layer, and the fourth organic insulating layer.

11. The semiconductor package of claim 10, wherein the organic interposer has a thickness equal to or smaller than about 50 μm.

12. The semiconductor package of claim 10, wherein the plurality of first vias have a diameter of about 30 μm to about 60 μm.

13. The semiconductor package of claim 10, wherein the plurality of redistribution layers have a line width of about 1/1 μm to about 3/3 μm.

14. The semiconductor package of claim 10, wherein the plurality of second vias have a diameter of about 5 μm to about 15 μm, and
- wherein the plurality of second vias have a width that narrows toward the plurality of lower pads.

15. The semiconductor package of claim 10, wherein a number of the plurality of second vias connecting at least two of the plurality of redistribution layers provide an electrical connection between the first semiconductor chip and the second semiconductor chip.

16. The semiconductor package of claim 9, wherein the mold is on a side wall of at least one of the first semiconductor chip and the second semiconductor chip on the upper surface of the organic interposer, and wherein the mold exposes an upper surface of at least one of the first semiconductor chip and the second semiconductor chip.

17. The semiconductor package of claim 9, further comprising an under fill surrounding the plurality of lower pads and a plurality of lower bumps, the plurality of lower pads and the plurality of lower bumps being on a lower surface of the organic interposer between the organic interposer and the package substrate.

18. The semiconductor package of claim 9, wherein at least one of the first semiconductor chip and the second semiconductor chip comprises a memory, logic, a microprocessor, an analog element, a digital signal processor, and a system-on-chip.

19. A semiconductor package comprising:

a package substrate;

an organic interposer on the package substrate, the organic interposer comprising a stacked structure comprising a first organic insulating layer, a second organic insulating layer, a third organic insulating layer, and a fourth organic insulating layer comprising an organic compound;

a first semiconductor chip and a second semiconductor chip on the organic interposer;

a final mold surrounding the first semiconductor chip and the second semiconductor chip from an upper surface of the organic interposer;

a heat dissipation member on first upper surfaces and first upper portions of outer walls of the first semiconductor chip and on second upper surfaces and second upper portions of the second semiconductor chip, the heat dissipation member abutting the final mold; and an under fill surrounding a plurality of lower pads and a plurality of lower bumps, the plurality of lower pads and the plurality of lower bumps being on a lower surface of the organic interposer between the organic interposer and the package substrate, wherein the organic interposer further comprises:

a plurality of first vias penetrating from the first organic insulating layer to the fourth organic insulating layer, and connecting first upper pads on an upper surface of the fourth organic insulating layer and lower pads on a lower surface of the first organic insulating layer;

a plurality of redistribution layers in each of the first organic insulating layer, the second organic insulating layer, the third organic insulating layer, and the fourth organic insulating layer; and a plurality of second vias connecting at least two of the plurality of redistribution layers inside the first organic insulating layer, the second organic insulating layer, the third organic insulating layer, and the fourth organic insulating layer, wherein the plurality of first vias have a width that widens in a direction from the first upper pads to the lower pads, and wherein the heat dissipation member directly contacts an outer wall of the first semiconductor chip, an outer wall of the second semiconductor chip and an upper surface of the final mold.

20. The semiconductor package of claim 19, wherein the plurality of second vias have a diameter of about 5 μm to about 15 μm, and wherein the plurality of second vias have a width that narrows toward the plurality of lower pads.

* * * * *